United States Patent
Iida et al.

(10) Patent No.: US 6,236,388 B1
(45) Date of Patent: *May 22, 2001

(54) IMAGE DISPLAY SYSTEM FOR DISPLAYING IMAGES OF DIFFERENT RESOLUTIONS

(75) Inventors: Masayuki Iida; Yuji Hayashi, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/863,189

(22) Filed: May 27, 1997

(30) Foreign Application Priority Data

May 31, 1996 (JP) .................................................. 8-161027

(51) Int. Cl.[7] ................................ G09G 5/00; G09G 3/36
(52) U.S. Cl. ............................ 345/132; 345/100; 345/99; 348/556
(58) Field of Search .............................. 345/99, 100, 213, 345/3, 127, 132; 348/204, 87, 556

(56) References Cited

U.S. PATENT DOCUMENTS

| | | | |
|---|---|---|---|
| 4,990,904 | * | 2/1991 | Zenda ........................................ 345/3 |
| 5,351,064 | * | 9/1994 | Zenda ........................................ 345/3 |
| 5,448,260 | * | 9/1995 | Zenda et al. ........................... 345/132 |
| 5,592,194 | * | 1/1997 | Nishikawa ............................. 345/127 |
| 5,627,559 | * | 5/1997 | Tsuboyama et al. .................... 345/97 |
| 5,748,175 | * | 5/1998 | Shimada et al. ...................... 345/127 |
| 5,771,040 | * | 6/1998 | Kim ........................................ 345/213 |
| 5,844,539 | * | 12/1998 | Kitagawa .............................. 345/100 |

FOREIGN PATENT DOCUMENTS

| | | |
|---|---|---|
| 0 421 772 A2 | 4/1991 | (EP) . |
| 0 540 294 A2 | 5/1993 | (EP) . |

* cited by examiner

*Primary Examiner*—Steven Saras
*Assistant Examiner*—Amr Awad
(74) *Attorney, Agent, or Firm*—Ronald P. Kananen; Rader, Fishman & Grauer

(57) ABSTRACT

A system for displaying images of varying resolution (i.e., XGA, SVGA, VGA) on a pixel-addressed screen surrounds selected-resolution images with blanked rows above and below the image and blanked columns to the left and the right of the displayed image. During the vertical blanking period, switches in the vertical scanning circuit blank non-image rows above and below the image, and, during horizontal scanning, switches in the horizontal scanning circuits blank columns on the left and right of each horizontal line so that the display image is bounded by a blanked screen portion. A black signal from a black-signal generator drives each blanked pixel to frame the displayed image in black.

11 Claims, 6 Drawing Sheets

IMAGE DISPLAY SYSTEM FOR DISPLAYING IMAGES OF DIFFERENT RESOLUTIONS

BACKGROUND OF THE INVENTION

1. Field of the Invention

The present invention relates to an image display system utilizing an active-matrix-type liquid-crystal panel or the like as a display. More particularly, the present invention relates to an image display system capable of appropriately displaying image signals having different resolution standards.

2. Description of the Related Art

Referring to FIG. 6, an example of a conventional active-matrix-type display panel will be described briefly. As shown in the figure, this display panel comprises a driving substrate 101, a counter substrate 102, and an electro-optic material 103 held between the driving substrate 101 and the counter substrate 102. As the electro-optic material 103, liquid crystal is widely used. A screen section 104 and a peripheral circuit section are integrated on the driving substrate 101. The peripheral circuit section (unnumbered) is divided into a vertical scanning circuit 105 and a horizontal scanning circuit 106. Further, terminal sections 107 for external connection are formed on the upper end of the driving substrate 101. The terminal section 107 is connected to the vertical scanning circuit 105 and the horizontal scanning circuit 106 via wiring 108. Meanwhile, a counter electrode (not shown) is formed entirely on the inner surface of the counter substrate 102. Gate lines 109 along the row direction and signal lines 110 along the column direction are formed on the screen section 104. The gate lines 109 are connected to the vertical scanning circuit 105, and the column signal lines 110 are connected to the horizontal scanning circuit 106. Pixels formed of pixel electrodes 111 and thin-film transistors 112 are integrated in the intersection portions of the vertical scanning circuit 105 and the horizontal scanning circuit 106. The vertical scanning circuit 105 includes a transferring stage for transferring a vertical start signal in sequence which is input from an external source in synchronization with a vertical clock signal which is input similarly from an external source, and selects in sequence the rows of pixels provided on the screen section 104. The horizontal scanning circuit 106 also includes a transferring stage which operates in response to a control signal, such as a horizontal start signal or a horizontal clock signal, which is input from an external source, and distributes image signals supplied from an external source in sequence to the columns of pixels and writes the image signals into selected pixels.

Image signals supplied from an external source have various standards concerning resolution. Examples of standards for television video signals include NTSC and PAL standards. It is assumed that the screen section of the display panel shown in FIG. 6 has a pixel array conforming to the NTSC standard. In cases where video signals of, for example, a PAL standard, are displayed on this display panel, conventionally, scanning line conversion of PAL video signals is performed so as to perform what is commonly called thinning-out driving of pixel rows. For this purpose, a field memory for temporarily storing video signals is required. Further, in cases where video signals conforming to a normal standard such that the aspect ratio of the screen section is determined at 4:3 are displayed on a display panel conforming to a wide standard such that the aspect ratio is determined at 16:9, a method has already been conceived in which aspect conversion from 16:9 to 4:3 is performed by causing both the left and right end portions of the screen section to be displayed in black. Furthermore, in recent years, an active-matrix-type display panel has been applied to displays for computer graphics. In this case also, a personal computer outputs image signals having various resolution standards. However, image signals output from a personal computer are signals previously formed in units of dots. If scanning line conversion similar to that of television video signals is performed in conformance with the resolution standard, what is commonly called moire occurs on the screen. More specifically, if the sampling timing of image signals shifts in terms of phase from the data array in dot units during the scanning line conversion process, phase differences of a relatively large cycle occur in the pixel array of the screen, and these phase differences appear as moire. Therefore, in order to suppress moire, it is necessary to cause the resolution of image signals supplied from the personal computer or the like to coincide with the pixel array provided on the screen of the display panel. In this case, if image signals (e.g., image signals of a VGA standard) having a relatively low resolution are displayed on a display panel designed for image signals (e.g., image signals of a SVGA standard) having a relatively high resolution, pixels to which image signals are not written remain in the peripheral portion of the screen, causing a blank area to occur. In order to improve the appearance of the screen, it is preferable that the blank area which is other than the display area be displayed black. Conventionally, to make such a black display, black display dot data is inserted among the image signals beforehand. For the purpose of performing such image signal processing, a field memory or a frame memory is required in the components of the image display system, causing problems in that the system configuration becomes complex and the cost is increased.

SUMMARY OF THE INVENTION

To these ends, according to one aspect of the present invention, there is provided an image display system, comprising: a driver for supplying a plurality of types of image signals having different resolution standards and a black signal independent of these image signals; a display panel having incorporated therein a screen formed of pixels arrayed in a matrix, a vertical scanning circuit provided with a first transferring stage for selecting the rows of the pixels in sequence, a horizontal scanning circuit provided with a second transferring stage for distributing image signals supplied from the driver in sequence to columns of the pixels and writing the image signals into selected pixels, and a horizontal auxiliary circuit for distributing a black signal supplied from the driver to columns of the pixels and writing the black signal into selected pixels; a timing generator for supplying a control signal to each circuit of the display panel according to the resolution of the image signals supplied from the driver in order to control the operation thereof; and first selector switches of the first transferring stage, which selector switches are incorporated within the vertical scanning circuit and cause the display area to change in accordance with the control signal.

Preferably, the first selector switch writes a black signal into the rows of pixels included in the upper and lower portions of the blank area of the display area during the vertical blanking period of the image signals.

Preferably, the horizontal scanning circuit has incorporated therein second selector switches of the second transferring stage, which selector switches cause the display area to change in accordance with the control signal.

Preferably, the second selector switch writes a black signal into the columns of pixels included on the right and left sides of the blank area when the black signal independent of the image signals is supplied from the driver.

Preferably, the display panel uses a liquid crystal as an electro-optic material.

According to another aspect of the present invention, there is provided a method of driving an image display apparatus comprising a screen formed of pixels arrayed in a matrix, a vertical scanning circuit provided with a first transferring stage for selecting the rows of the pixels in sequence, a horizontal scanning circuit provided with a second transferring stage for distributing image signals in sequence to columns of the pixels and writing the image signals into selected pixels, and a horizontal auxiliary circuit for distributing a black signal into columns of the pixels and writing the black signal into selected pixels, the method comprising the steps of: writing image signals into the display area within the screen including pixels of a number of rows and columns appropriate for a resolution; changing the display area by switching the first transferring stage by the first selector switch incorporated within the vertical scanning circuit; and writing a black signal into the rows of pixels included in the upper and lower portions of the blank area which is other than the display area during the vertical blanking period of the image signals.

Preferably, the opening/closing of the first selector switch is controlled in accordance with a control signal supplied from the timing generator.

The method may further comprise the steps of: changing the display area by switching the second transferring stage by the second selector switch incorporated within the horizontal scanning circuit; and writing a black signal to the columns of pixels included on the right and left sides of the blank area when the black signal independent of the image signals is supplied.

Preferably, the opening/closing of the second selector switch is controlled in accordance with a control signal supplied from the timing generator.

The image display system in accordance with the present invention is structured in such a way that image signals having different resolutions can be displayed on the same display panel. In a case where the resolution of image signals supplied from the driver is small with respect to the number of pixels which form the screen of the display panel, the blank area which is not a part of the display area is displayed in black. For this purpose, the driver inputs a black signal independently of the image signals to the display panel. Therefore, unlike in the past, no signal processing for performing a black display is required. In relation to this, the display panel comprises a horizontal auxiliary circuit for writing a black signal in addition to the vertical scanning circuit and the horizontal scanning circuit for writing image signals. The vertical scanning circuit and the horizontal scanning circuit have incorporated therein selector switches for the transferring stage. By controlling the opening/closing of the selector switches in accordance with a control signal supplied from the timing generator, it becomes possible to write image signals to the display area and write a black signal to the blank area. That is, in the present invention, in a case where a plurality of types of image signals having different resolution standards are displayed, no signal processing needs to be performed by the driver, and everything can be handled by the display panel.

The above and further objects, aspects and novel features of the invention will become more apparent from the following detailed description when read in connection with the accompanying drawings.

DESCRIPTION OF THE PREFERRED EMBODIMENT

Figure 1:
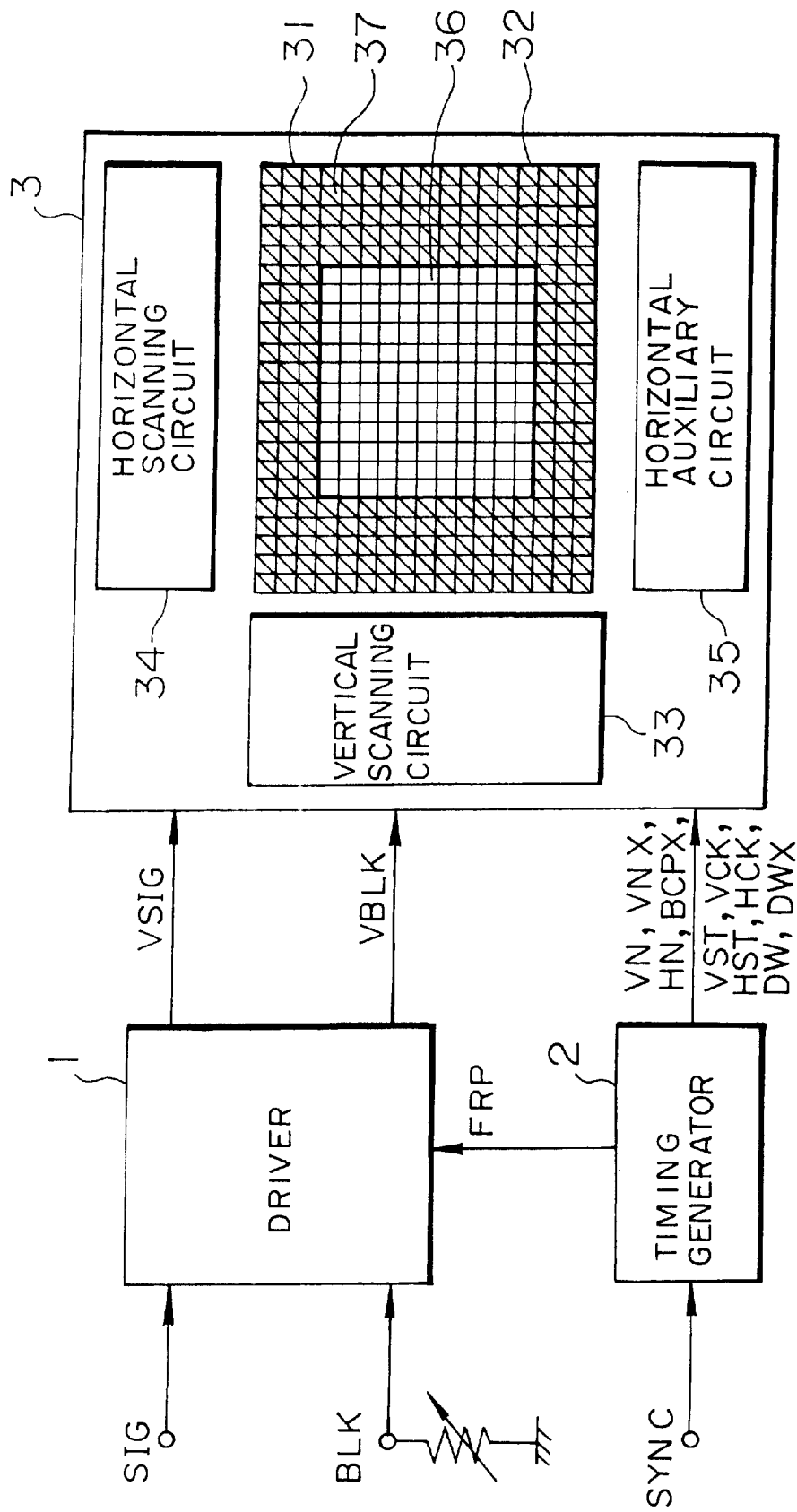
FIG. 1 is a block diagram illustrating the basic construction of an image display system according to the present invention.

The preferred embodiment of the present invention will be described below with reference to the accompanying drawings. FIG. 1 is a block diagram illustrating the overall construction of an image display system according to the present invention. As shown in the figure, this image display system comprises a driver 1, a timing generator 2, and a display panel 3. The driver 1 selectively supplies a plurality of types of image signals VSIG having different resolution standards to the display panel 3. The driver 1 performs a process for converting original image signals SIG output from a personal computer or the like into alternating current in accordance with a conversion-into-alternating-current signal FRP supplied from the timing generator 2 and outputs image signals VSIG separated for each of RGB. The driver 1 further supplies a black signal VBLK independent of the image signals VSIG to the display panel 3. To be specific, upon receiving a level-adjustable black-level voltage BLK, the driver 1 performs a conversion-into-alternating-current process on this voltage in accordance with the FRP signal supplied from the timing generator 2 and outputs a final black signal VBLK to the display panel 3 through a system different from that of the image signals VSIG.

The display panel 3 comprises a screen 31, with a large number of pixels 32 being arrayed in a matrix on the screen 31. This display panel 3 is of a peripheral-circuit-incorporated type, with a vertical scanning circuit 33, a horizontal scanning circuit 34 and a horizontal auxiliary circuit 35 being integrated on the same substrate in the outer regions of the screen 31. The vertical scanning circuit 33 comprises a transferring stage formed of a shift register, and selects in sequence the rows of the pixels 32 provided on the screen 31. The horizontal scanning circuit 34 also comprises a transferring stage formed of a shift register, and distributes in sequence the image signals VSIG supplied from the driver 1 to the columns of pixels 32 and writes the signals to the selected pixels 32. The horizontal auxiliary circuit 35 distributes the black signal VBLK supplied from the driver 1 to the columns of pixels 32 and writes the black signal to the selected pixels 32.

Based on a synchronization signal SYNC supplied from the personal computer 1, the timing generator 2 outputs various control signals to each of the circuits 33, 34 and 35 of the display panel 3 according to the resolution of the image signals VSIG supplied to the display panel 3 from the driver 1 in order to control the operation of the circuits. These control signals include VST, VCK, VN, VNX, BCPX, DW, and DWX which are supplied to the vertical scanning circuit 33. VST is a vertical start signal, and VCK is a vertical clock signal. VN and VNX, which are in phases opposite to each other, are transfer switching signals for controlling the switching of the transferring stage. BCPX is a pulse signal for writing a black signal to the blank area during the vertical blanking period. DW and DWX, which are in phases opposite to each other, are transfer reverse signals for switching the transfer operation of the transferring stage between the forward and reverse directions. By switching the transfer direction, the upside-down display of images becomes possible. HST, HCK, and HN for the horizontal scanning circuit 34 are included among the control signals supplied from the timing generator 2. HST is a horizontal start signal, and HCK is a horizontal clock signal. Further, HN is a transfer switching signal for switching the display area. VN and HN are supplied also to the horizontal auxiliary circuit 35 from the timing generator 2. With such a construction, the image signals VSIG are written to a display area 36 within the screen 31 with the number of rows and columns appropriate for the resolution of the image signals VSIG, and the black signal VBLK is written to the pixels 32 belonging to a blank area 37 which is other than the display area 36. To be specific, the vertical scanning circuit 33 has incorporated therein transferring stage selector switches (described below) for changing the display area 36 in accordance with the transfer switching signal VN, and writes the black signal VBLK to the rows of pixels 32 included in the upper-side and lower-side portions of the blank area 37 during the vertical blanking period. In a similar manner, the horizontal scanning circuit 34 has incorporated therein transferring stage selector switches for changing the display area 36 in accordance with the transfer switching signal HN, and writes the black signal VBLK to the columns of pixels 32 included in the right and left sides of the blank area 37.

Figure 2A:
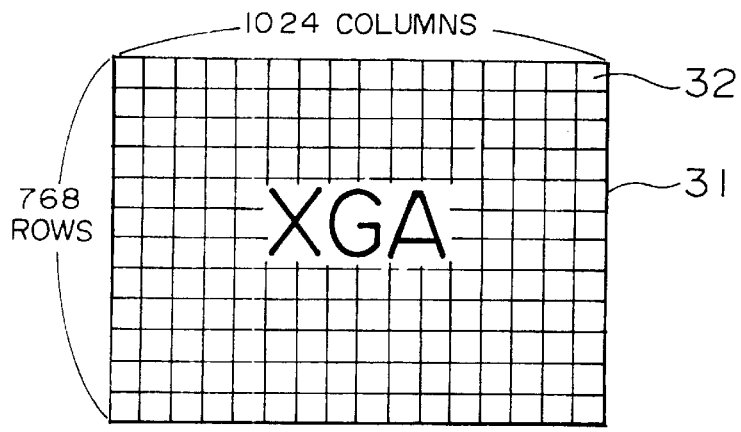
FIG. 2 comprising FIG. 2A, FIG. 2B
FIG. 2C is a schematic diagram illustrating the operation of the image display system shown in FIG. 1.

The operation of the image display system shown in FIG. 1 will be described in detail with reference to FIGS. 2A, 2B and 2C. As shown in FIG. 2A, in this example, the display panel 3 comprises the screen 31 conforming to the XGA standard. That is, image signals of the XGA standard have a high resolution, and in relation to this high resolution, the screen 31 includes pixels 32 for an amount of 768 rows× 1024 columns. In a case where image signals VSIG of the XGA standard are supplied from the driver 1, normal display driving is performed on the display panel 3 by using all the pixels 32 included in the screen 31. That is, in this case, the whole of the screen 31 becomes a display area, and no blank area occurs.

Figure 2B:
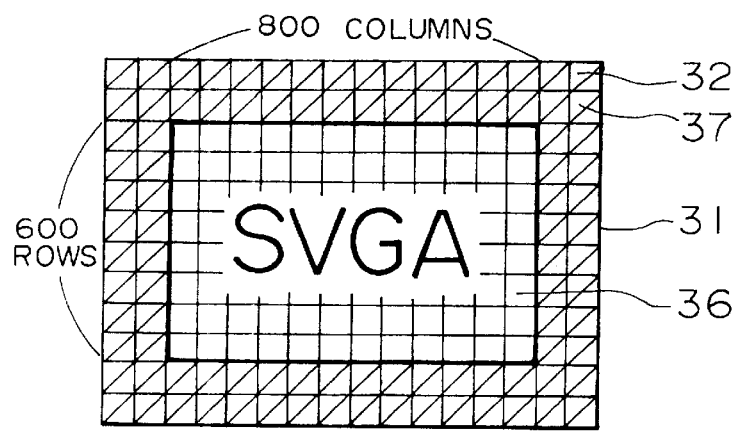

FIG. 2B shows a display state in a case where image signals of the SVGA standard are supplied to a display panel designed for the XGA standard. The SVGA standard has a resolution lower than that of the XGA standard, and corresponds to a pixel array of 600 rows×800 columns. Thus, in the present invention, image signals are written to the display area 36 within the screen 31 including pixels 32 with a number of rows (600 rows) and columns (800 columns) appropriate for the resolution of the SVGA standard. A black signal is written to the pixels 32 belonging to the blank area 37 which is other than this display area 36. As described above, since the resolution of image signals to be displayed and the pixel array of the display area completely correspond to each other in the present invention, problems of a moire or the like do not occur.

Figure 2C:
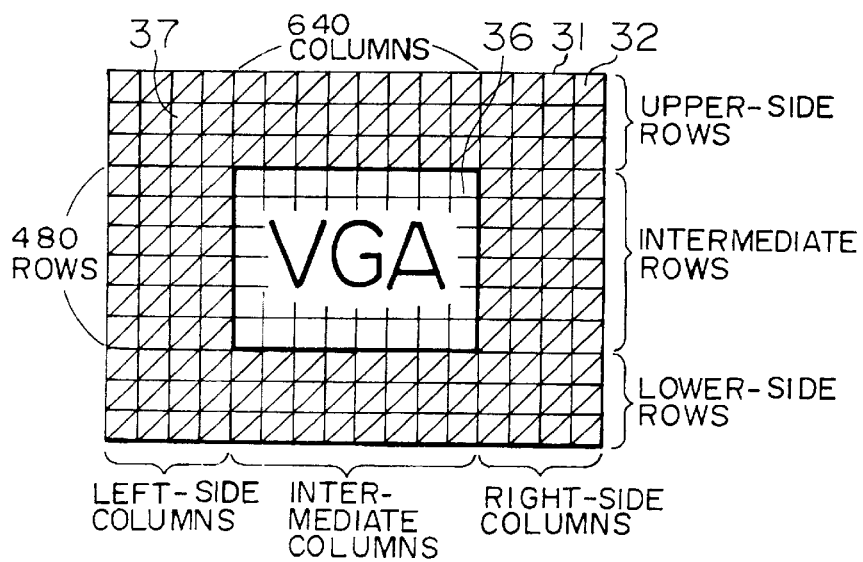

FIG. 2C shows a display state of the display panel in a case where image signals of the VGA standard having a resolution still lower than that of the SVGA standard are supplied from the driver. In this case, the writing of the image signals of the VGA standard is limited to the display area 36 including the pixels 32 for an amount of 480 rows×640 columns. A black signal is written to the blank area 37 which is other than this display area 36. In this case, the timing generator 2 causes a part of the transferring stage included in the vertical scanning circuit 33 of the display panel 3 to simultaneously operate during the vertical blanking period of the image signals in order to collectively write a black signal to the rows (the upper-side and lower-side rows) of the pixels included in the upper-side and lower-side portions of the blank area 37. Thereafter, with respect to each intermediate row between the upper-side rows and the lower-side rows, a black signal and image signals are written in sequence to each pixel in a normal transfer operation. In this case, a black signal independent of the image signals is supplied to the left and right sides belonging to the blank area 37, and at the same time the image signals are supplied to the display area 36. The black signal and the image signals are written in sequence simultaneously to these areas in accordance with a normal transfer operation. In this way, the image signals of the VGA standard are written to only the display area 36 defined in the intersection portions of the intermediate rows and the intermediate columns. Although the above-described embodiment is a case in which image signals of the SVGA or VGA standard are written to a display panel of the XGA standard, the present invention is not limited to this case, and is applicable to, for example, a case in which image signals of the VGA or NTSC standard are displayed on a display panel of the SVGA standard. In the present invention, it is possible to display image signals of the VGA standard and video signals of the NTSC standard by increasing or decreasing the blank area without using a field memory for black display.

Figure 3:
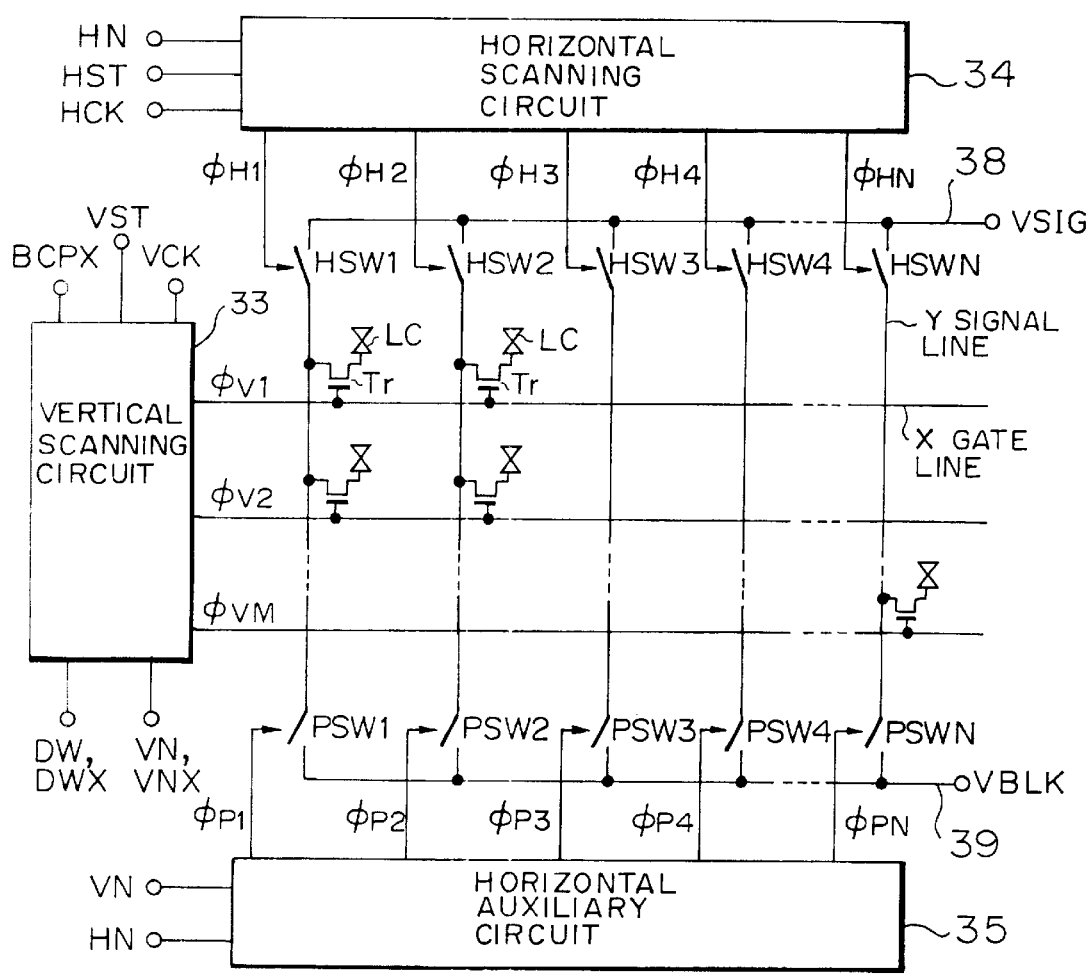
FIG. 3 is a block diagram illustrating an example of a specific construction of the display panel included in the image display system shown in FIG. 1.

FIG. 3 is a block diagram illustrating an example of a specific construction of the display panel 3 shown in FIG. 1. As shown in the figure, this display panel comprises gate lines X arrayed in a row form and signal lines Y arrayed in a column form. Further, liquid-crystal pixels LC are arrayed in a matrix in the intersection portions of the gate lines X and the signal lines Y. This display panel comprises liquid-crystal pixels; however, of course, pixels formed of other electro-optic materials may be possible. The liquid-crystal pixels LC are driven by thin-film transistors Tr. The source electrodes of the thin-film transistors Tr are connected to the corresponding signal lines Y, the gate electrodes are connected to the corresponding gate lines X, and the drain electrodes are connected to the corresponding liquid-crystal pixels LC.

A vertical scanning circuit 33 is connected to each gate line X. This vertical scanning circuit 33, which includes a shift register (transferring stage) in which, for example, D-type flip-flops (DFF) are connected in multiple steps, transfers a vertical start signal VST in sequence in accordance with a vertical clock signal VCK, and supplies selection pulses $\Phi_{V1}, \ldots, \Phi_{VM}$ to each gate line X, thereby scanning each gate line X in sequence and selecting the liquid-crystal pixels LC for one row at every horizontal period.

Meanwhile, individual signal lines Y are connected to an input line 38 via corresponding horizontal switching elements HSW. Image signals VSIG are supplied from the driver 1 to this input line 38. There is further provided a horizontal scanning circuit 34 which controls the opening/ closing of each horizontal switching element HSW. That is, the horizontal scanning circuit 34, similar to the vertical scanning circuit 33, includes a shift register in which DFFs are connected in multiple steps. By transferring a horizontal start signal HST in sequence in synchronization with a horizontal clock signal HCK, sampling pulses $\Phi_{H1}$, $\Phi_{H2}$, . . . , $\Phi_{HN}$ are output to open/close the horizontal switching elements HSW. Through such an operation, the image signals VSIG are sampled by each signal line Y, and the image signals VSIG are written to the liquid-crystal pixels LC for one row selected within one horizontal period via thin-film transistors Tr in a conducting state.

The individual signal lines Y are connected to another input line 39 via different horizontal switching elements PSW. The black signal VBLK is supplied to this input line 39 from the driver 1. There is further provided the horizontal auxiliary circuit 35, which controls the opening/closing of each horizontal switching element PSW. That is, the horizontal auxiliary circuit 35 selectively outputs sampling pulses $\Phi_{P1}$, $\Phi_{P2}$, $\Phi_{P3}$, . . . , $\Phi_{PN}$ in accordance with the transfer switching signals VN and HN supplied from the timing generator 2 in order to open/close the switching elements PSW. The black signal VBLK is sampled by each signal line Y, and the black signal VBLK is written to the pixels LC for one row selected within one horizontal period via thin-film transistors Tr in a conducting state.

Referring again to FIG. 3, the operation of the display panel will be described. As shown in FIG. 2A, in a case where image signals of the XGA standard are input, only the image signals VSIG are written to all of the liquid-crystal pixels LC included in the screen. Therefore, the shift register of the vertical scanning circuit 33 outputs a selection pulse $\Phi_V$ in sequence from the beginning stage to the final stage. Also, the horizontal scanning circuit 34 performs a normal transfer operation and outputs a sampling pulse $\Phi_H$ in sequence from the beginning stage to the final stage. As a result, the image signals VSIG of the XGA standard are written in the correct amount to all of the liquid-crystal pixels LC. In this case, the horizontal auxiliary circuit 35 holds all the switching elements PSW in an open state (non-conducting state) and the horizontal auxiliary circuit 35 does not function to write the black write signal pulse VBLK to any of the pixels 32.

Meanwhile, as shown in FIG. 2C, in a case where image signals VSIG of the VGA standard are written, initially, the black signal VBLK is collectively written to the upper-side and lower-side rows belonging to the blank area during the vertical blanking period. For this purpose, the vertical scanning circuit 33 selects only transferring stages corresponding to the upper-side and lower-side rows in accordance with transfer switching signals VN and VNX. Then, a black write pulse signal BCPX supplied from the timing generator is simultaneously output from the selected transferring stages to the corresponding gate lines X during the vertical blanking period. In such a case, the vertical scanning circuit 33 causes the stages corresponding to the intermediate rows to be placed in a non-selection state in accordance with the transfer switching signals VN and VNX. Meanwhile, the horizontal auxiliary circuit 35 enters an operating state in accordance with the transfer switching signal VN, causing a sampling pulse $\Phi_P$ to be output simultaneously and all the PSWs to be placed in a closed state (conducting state) in order to write the black signal VBLK to selected upper side and lower side rows X. In comparison, the horizontal scanning circuit 34 is placed in a pause state during the vertical blanking period. Next, after the vertical blanking period has elapsed, as shown in FIG. 2C, the black signal VBLK and the image signals VSIG are written to the intermediate rows in a column-divided manner. In this case, the vertical scanning circuit 33 selects in sequence only the transferring stages corresponding to the intermediate rows in accordance with the transfer switching signals VN and VNX, and outputs a selection pulse $\Phi_V$ to only the gate lines X of the intermediate rows by a normal operation. Since a black signal is written first, the horizontal scanning circuit 34 is first placed in a pause state during each horizontal blanking period. Meanwhile, the horizontal auxiliary circuit 35 places only the horizontal switching elements PSW corresponding to the right-side and left-side columns included in the blank area in a conducting state in accordance with a transfer switching signal HN, thereby supplying the black signal VBLK to the pixels positioned on the right and left sides of the blank area. When the horizontal scanning circuit 34 enters an operating state, at the same time when a black signal is written to the pixels positioned on the right and left sides of the blank area, image signals are written to the pixels included in the display area between the right and left blanked sides. As a result, the image signals VSIG are written to only the display area.

Figure 4:
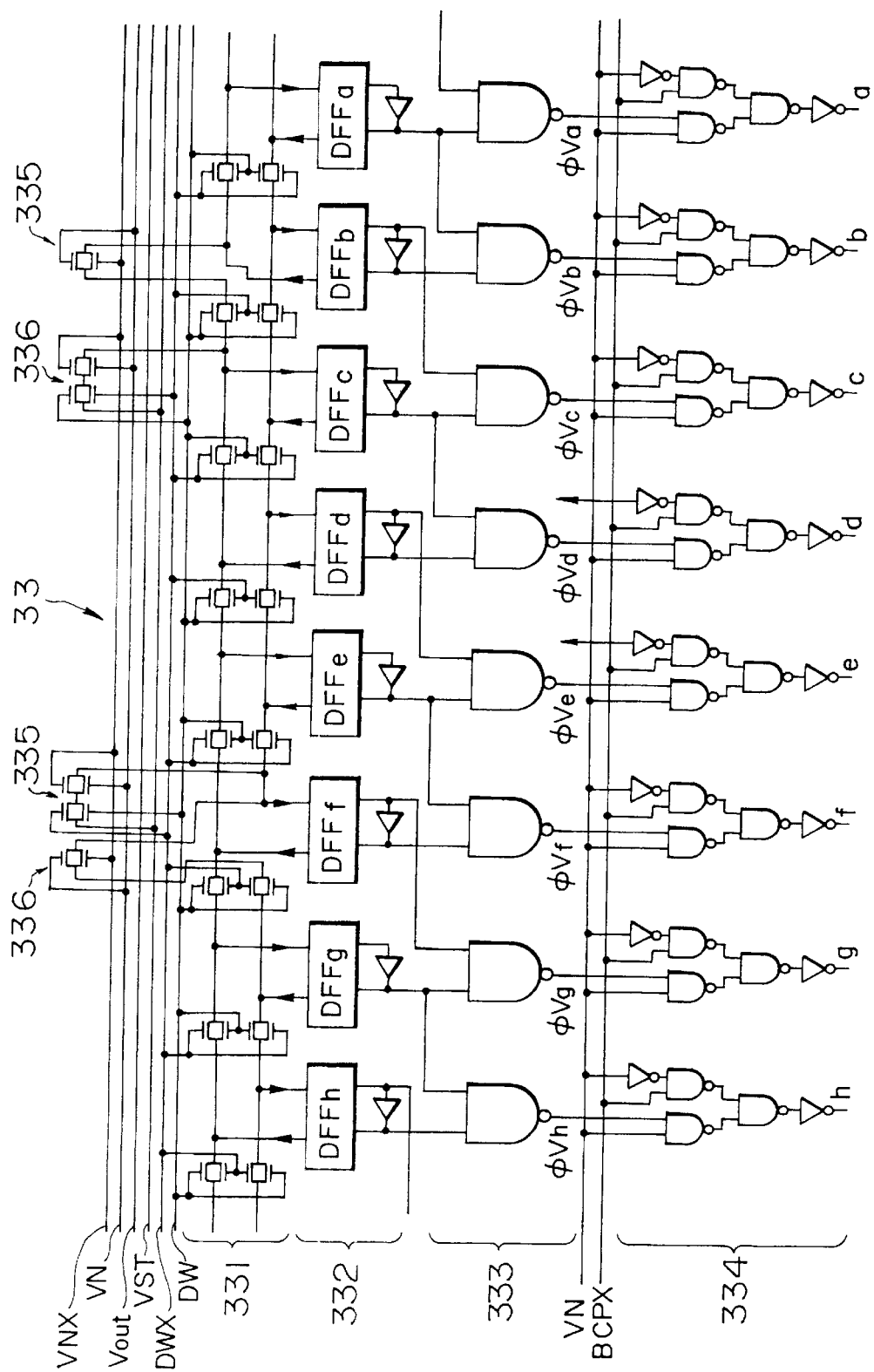
FIG. 4 is a circuit diagram illustrating an example of the construction of a vertical scanning circuit incorporated in the display panel shown in FIG. 3.

FIG. 4 is a circuit diagram illustrating an example of a specific construction of the vertical scanning circuit 33 shown in FIG. 3. The horizontal scanning circuit 34 also has a similar construction. As shown in the figure, the vertical scanning circuit 33 comprises a transfer path 331, a transferring stage 332, an intermediate stage 333, and an output stage 334. There are further provided first selector switches 335, and second selector switches 336. In this figure, stage numbers corresponding to each gate line X are designated a to h. The transferring stage 332 constitutes a shift register in which DFFa to DFFh are connected in multiple steps. This shift register generates selection pulses $\Phi_{Va}$ to $\Phi_{Vh}$ by sequentially transferring VST in synchronization with VCK. The vertical start signal VST is transferred in sequence via the transfer path 331 through which each DFF is connected. In this embodiment, the vertical scanning circuit 33 has a construction that the transfer direction can be switched between the forward and reverse directions so that upside-down display of images is possible. In order to control this upside down transfer direction, transfer reverse signals DW and DWX are supplied from the timing generator. When DW reaches a high level and DWX reaches a low level, VST is transferred in a forward direction from the DFFa toward the DFFh. On the contrary, when DW reaches a low level and DWX reaches a high level, VST is transferred in a reverse direction from the DFFh toward the DFFa. Switching this transfer direction is performed by selectively opening/closing transmission gate elements present in the transfer path 331 in accordance with DW and DWX. Each DFF transfers VST in sequence at every half cycle of VCK. Therefore, in this example, by performing an AND process of pulses output from the neighboring DFFs by the gate elements included in the intermediate stage 333, final selection pulses $\Phi_{Va}$ to $\Phi_{Vh}$ are generated.

This vertical scanning circuit 33 comprises the first selector switches 335 and the second selector switches 336 in order to switch the transferring stage 332. Here, a description will be given of a case of transfer in the forward direction. In a case where a normal display without a black display is performed, the transfer switching signal VN reaches a high level, and the VNX reaches a low level. In this case, the first selector switches 335 and the second selector switches 336 do not function, and the transfer path 331 is not interrupted. Therefore, the VST is transferred in sequence via the transfer path 331 from the DFFa to the DFFh. On the contrary, in a case where a black display is made, the VN reaches a low level, and the VNX reaches a high level. In this case, since the first selector switches 335 are closed, the transfer path 331 is interrupted between the DFFb and the DFFc. Similarly, the transfer path is interrupted between the DFFe and the DFFf. Meanwhile, the second selector switch 336 enters a conducting state, and the VST is supplied to the input terminal of the DFFc via the second selector switch 336. Therefore, the VST is transferred only from the DFFc to the DFFe. Although the number of stages is set to 3 for the purpose of facilitating understanding, in practice, the number reaches a considerable number. Within the screen, the display area is only a portion corresponding to the stages to which the VST is actually transferred, and the portion corresponding to the stages separated from the transfer path becomes a blank area. In the example shown in the figure, two stages d and e belong to the display area, and the other stages a, b, c, f, g, and h belong to the blank area.

The selection pulse $\Phi_V$ output from the intermediate stage 333, the transfer switching signal VN and the black write pulse signal BCPX are all supplied to the output stage 334. In the case where a black display is made, VN reaches a low level as described above, causing each selection pulse $\Phi_V$ to be separated from the output stage 334. Meanwhile, the black write pulse signal BCPX input during the vertical blanking period passes through the output stage 334. At this time, only the stages d and e belonging to the display area are formed beforehand in such a way that the passing of BCPX is cut off. As a result, during the vertical blanking period, the pulse signal BCPX in place of the normal selection pulse $\Phi_V$ is simultaneously output to the stages a, b, c, f, g, and h belonging to the blank area. As a result, by outputting BCPX during the vertical blanking period, it is possible to simultaneously access only the blank area which is desired to be displayed in black. At this time, a black display is made by simultaneously distributing the black signal VBLK from the horizontal auxiliary circuit 35 to the signal lines Y. After the vertical blanking period has elapsed, BCPX is no longer output. In its place, normal selection pulses are output in sequence to the gate lines X belonging to the display area. In this example, by providing one set of selector switches, the switching of display areas between two types of image signals is performed. The present invention is not limited to this example, and by increasing the number of sets of selector switches and increasing the number of input lines of DN and DNX in correspondence with this increase in the number of sets, it becomes possible in principle to switch the display area for any number of types of image signals. Further, selector switches are similarly incorporated in the horizontal scanning circuit. By controlling the selector switches at the same time as the vertical scanning circuit, it becomes possible to make a black display with respect to the blank area in a frame form.

Figure 5:
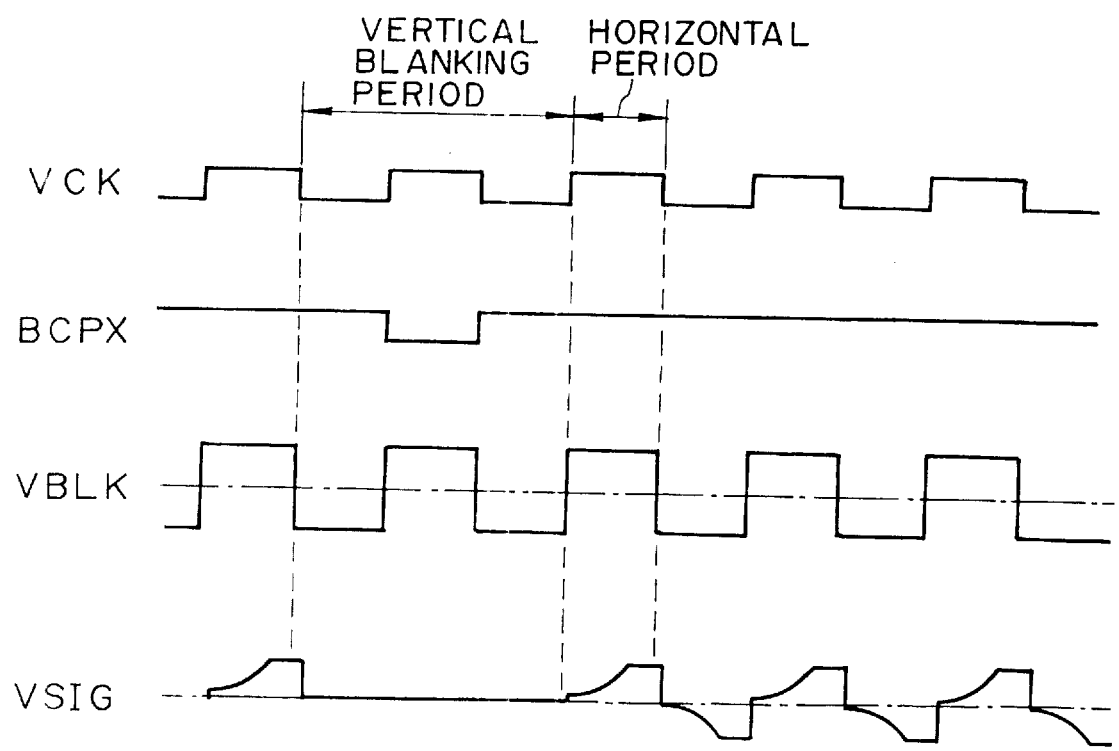
FIG. 5 is a timing chart illustrating the operation of the vertical scanning circuit shown in FIG. 4.
Figure 6:
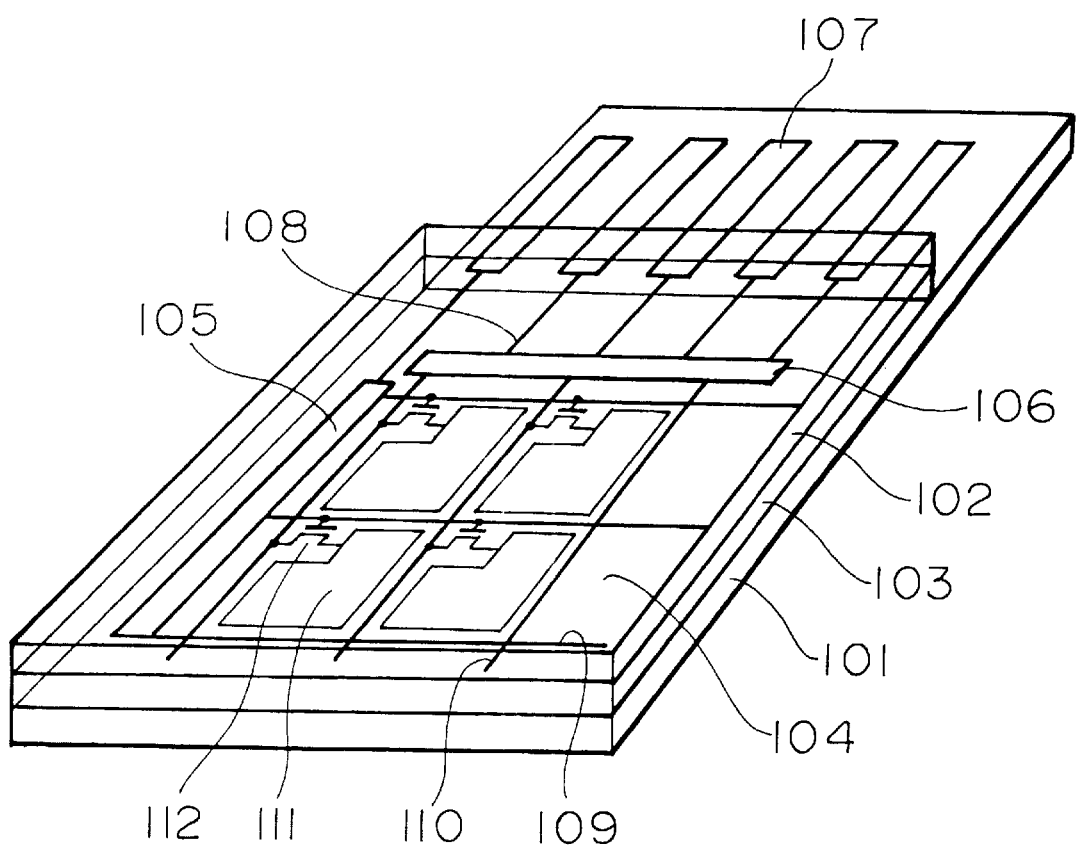
FIG. 6 is a schematic perspective view illustrating an example of a conventional display panel.

FIG. 5 shows a writing timing of a black signal in the vertical scanning circuit shown in FIG. 4. A part of the transferring stage included in the vertical scanning circuit of the display panel is simultaneously operated during the vertical blanking period of the image signals in order to collectively write the black signal VBLK to the upper-side and lower-side rows of the blank area. That is, the timing generator supplies a single pulse signal BCPX during the vertical blanking period. The vertical scanning circuit on the display panel side simultaneously outputs BPCX in place of the selection pulse $\Phi_V$ to the gate lines X corresponding to the upper-side and lower-side rows, causing the black signal VBLK to be collectively written to all the upper-side and lower-side rows. After this vertical blanking period has elapsed, the display panel enters a normal operation, and the image signals VSIG and the black signal VBLK are written to the pixels for one row every horizontal period in a column-divided manner. In this way, in this example, the upper-side and lower-side rows of the blank area are selected collectively in a specific time (output time of BCPX) within the vertical blanking period, and at the same time the black signal VBLK is written to the pixels in the upper-side and the lower-side rows. Since this driving method does not require high-speed transfer, it is possible to take sufficient time to write a pixel electrical potential. However, it is not possible to write a black signal to a blank area with the drive method of reversing every line. Therefore, in this driving method, the black signal is written to the upper-side and lower-side rows of the blank area with the drive method of reversing every field.

As has been described up to this point, according to the present invention, in a case where image signals having different resolutions are displayed on the same display panel, since the blank area which is other than the display area is displayed in black, a black signal independent of image signals is supplied to the display panel. On the display panel side, selector switches are incorporated within the vertical scanning circuit and the horizontal scanning circuit. By controlling these selector switches, it is possible to distribute the image signals to the display area and distribute the black signal to the blank area. In this way, according to the present invention, a black-frame display becomes possible by control only from the panel side without providing a frame memory for processing image signals on the driver side. Further, if a plurality of sets of selector switches are provided as required, it becomes possible in principle to display image signals to every angle of view.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An image display system, comprising:
   a driver for supplying a plurality of types of image signals having different resolution standards and for supplying a black signal independent of the plurality of types of image signals;
   a display panel having incorporated therein a screen formed of pixels arrayed in row/column matrix, a vertical scanning circuit provided with a first transferring stage for selecting the rows of said pixels in sequence, a horizontal scanning circuit provided with a second transferring stage for distributing image signals supplied from said driver in sequence to columns of said pixels and writing the image signals into selected pixels, and a horizontal auxiliary circuit for distributing a black signal supplied from said driver to columns of said pixels and writing the black signal into selected pixels of said columns;
   a timing generator for supplying a control signal to each circuit of said display panel according to the resolution of the image signals supplied from said driver in order to control the operation thereof; and first selector switches of said first transferring stage, wherein said first selector switches have been incorporated within said vertical scanning circuit and cause the area of the displayed image to change in accordance with said control signal.

2. The image display system according to claim 1, wherein said first selector switches of said first transferring stage write the black signal into the rows of pixels included in the upper and lower portions of said display area during the vertical blanking period of the image signals.

3. The image display system according to claim 1, wherein said horizontal scanning circuit has incorporated therein second selector switches of said second transferring stage, which selector switches cause the area of the displayed image to change in accordance with said control signal.

4. The image display system according to claim 3, wherein said second selector switches write the black signal into the columns of pixels included on the right and left sides of an area where the image is not displayed when the black signal independent of said image signals is supplied from the driver.

5. An image display system according to claim 1, wherein said display panel uses a liquid crystal as an electro-optic material.

6. An image display system according to claim 1, wherein said vertical scanning circuit, said horizontal scanning circuit, and said horizontal auxiliary circuit comprises thin-film transistors.

7. A method of driving an image display apparatus to display image signals of different resolutions having a screen formed of pixels arrayed in a row and column matrix and having a vertical scanning circuit provided with a first transferring stage for selecting the rows of said pixels in sequence and having first selector switches incorporated therein, a horizontal scanning circuit provided with a second transferring stage for distributing image signals in sequence to columns of said pixels and writing the image signals into selected pixels and having second selector switches incorporated therein, a horizontal auxiliary circuit for distributing a black signal independent of the image signals into columns of said pixels and writing the black signal into selected pixels, and a timing generator for providing control signals to said vertical scanning circuit, said horizontal scanning circuit, and said horizontal auxiliary circuit, said method comprising the steps of:

writing image signals into the display area within the screen including pixels of a number of rows and columns appropriate for the image resolution;

changing the display area by switching the first transferring stage by the first selector switch; and writing the black signal into the rows of pixels included in the upper and lower portions of the display which is other than the image display area during the vertical blanking period of the image signals.

8. A method of driving an image display apparatus according to claim 7, further comprising the step of:

controlling the opening/closing of said first selector switch in accordance with a control signal supplied from the timing generator.

9. A method of driving an image display apparatus according to claim 7, further comprising the steps of:

changing the display area by switching the second transferring stage by the second selector switches; and writing a black signal to the columns of pixels included on the right and left sides of image-display area when the black signal independent of the image signals is supplied.

10. A method of driving an image display apparatus according to claim 9, further comprising the step of:

controlling the opening/closing of said second selector switch in accordance with a control signal supplied from the timing generator.

11. An image display system for displaying images of different resolutions on an image display having a plurality of pixels arrayed in a matrix of rows and columns, at least one of the different resolution images having a resolution such that less than all pixels of the display are utilized for image display, comprising:

a driver for supplying a plurality of types of image signals having different resolution standards and for supplying a black signal independent of the image signals;

a display panel having incorporated therein a screen formed of pixels arrayed in a matrix of rows and columns, a vertical scanning circuit provided with a first transferring stage for selecting the rows of said pixels in sequence, a horizontal scanning circuit provided with a second transferring stage for selecting the columns of said pixels and distributing image signals supplied from said driver in sequence to pixels of said selected columns and writing the image signals into selected pixels, and a horizontal auxiliary circuit for selecting the columns of said pixels and for distributing a black signal supplied from said driver to columns of said pixels and writing the black signal into selected pixels;

a timing generator for supplying a control signal to each circuit of said display panel according to the resolution of the image signals supplied from said driver in order to control the operation thereof; and said first transferring stage of said vertical scanning circuit having row-selection switches therein for selecting rows for displaying said black signal when the resolution of the image signal is less than the resolution of the display, said rows for displaying said black signal selected during a vertical blanking period and said horizontal auxiliary circuit distributing a black signal supplied from said driver to pixels in said selected rows for displaying said black signal during said vertical blanking period;

said second transferring stage of said horizontal scanning circuit having columns-selection switches for selecting columns for displaying said black signal when the resolution of the image signal is less than the resolution of the display, said columns for displaying said black signal selected during a horizontal scanning period during which the black signal is supplied from said driver to pixels in said columns for displaying said black signal and the image signal is supplied to pixels in columns other than the columns selected for displaying said black signal.

* * * * *